United States Patent
Lee et al.

(10) Patent No.: US 9,620,737 B2
(45) Date of Patent: Apr. 11, 2017

(54) ORGANIC LIGHT EMITTING DISPLAY APPARATUS

(71) Applicant: SAMSUNG DISPLAY CO., LTD., Yongin-si, Gyeonggi-do (KR)

(72) Inventors: Hyesog Lee, Osan-si (KR); Chi-o Cho, Gwangju (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/015,199

(22) Filed: Feb. 4, 2016

(65) Prior Publication Data
US 2016/0285043 A1 Sep. 29, 2016

(30) Foreign Application Priority Data

Mar. 24, 2015 (KR) .......................... 10-2015-0040970

(51) Int. Cl.
*H01L 51/52* (2006.01)
*H01L 51/50* (2006.01)

(52) U.S. Cl.
CPC ...... *H01L 51/5253* (2013.01); *H01L 51/5012* (2013.01); *H01L 51/5268* (2013.01); *H01L 51/5293* (2013.01)

(58) Field of Classification Search
CPC ............. H01L 51/5253; H01L 51/5268; H01L 51/5293; H01L 51/5012
See application file for complete search history.

(56) References Cited

U.S. PATENT DOCUMENTS

| 8,469,551 | B2* | 6/2013 | Wolk | H01L 51/5275 313/112 |
| 8,538,224 | B2 | 9/2013 | Lamansky et al. | |
| 8,618,730 | B2* | 12/2013 | Park | H01L 51/5275 313/498 |
| 8,659,221 | B2* | 2/2014 | Jones | B82Y 20/00 313/498 |

(Continued)

FOREIGN PATENT DOCUMENTS

| JP | 2012-109262 A | 6/2012 |
| KR | 10-2011-0013049 A | 2/2011 |

(Continued)

OTHER PUBLICATIONS

Arfat Pradana et al., Multiperiod gratings in a high refractive index material for enhanced OLED outcoupling, Institute of Electrical and Information Engineering, Renewable Energy and the Environment Technical Digest, 2011, 3 Pages, 6 Sections.

*Primary Examiner* — Jarrett Stark
(74) *Attorney, Agent, or Firm* — Lee & Morse P.C.

(57) ABSTRACT

An organic light emitting display apparatus includes a substrate including a pixel region, a first electrode on the substrate, a second electrode on the first electrode, an organic light emission layer between the first and second electrodes to emit light, a plurality of layers on the second electrode, and a light compensation pattern on the second electrode and overlapping the pixel region, the light compensation pattern including a plurality of protrusion patterns having progressively decreasing widths as a distance from a center of the pixel region increases, and a plurality of grooves separating the protrusions in a direction parallel to the substrate from the center of the pixel region.

16 Claims, 12 Drawing Sheets

(56) References Cited

U.S. PATENT DOCUMENTS

| | | | |
|---|---|---|---|
| 9,130,367 B2* | 9/2015 | Yamazaki | H02H 9/044 |
| 9,257,677 B2* | 2/2016 | Park | H01L 51/5275 |
| 9,324,737 B2* | 4/2016 | Yamazaki | H01L 27/124 |
| 2007/0290607 A1* | 12/2007 | Okada | G02B 5/1871 |
| | | | 313/504 |
| 2008/0180025 A1* | 7/2008 | Baba | G02B 5/201 |
| | | | 313/504 |
| 2010/0060149 A1* | 3/2010 | Song | H05B 33/26 |
| | | | 313/504 |
| 2011/0234088 A1* | 9/2011 | Abe | G02B 5/0215 |
| | | | 313/504 |
| 2016/0020431 A1* | 1/2016 | Yamae | H01L 51/5268 |
| | | | 257/40 |
| 2016/0093641 A1* | 3/2016 | Takahashi | G09G 3/34 |
| | | | 257/43 |
| 2016/0093827 A1* | 3/2016 | Han | H01L 51/5246 |
| | | | 257/40 |
| 2016/0172624 A1* | 6/2016 | Fukuda | H01L 51/5246 |
| | | | 257/40 |
| 2016/0293892 A1* | 10/2016 | Yamae | H01L 51/5268 |

FOREIGN PATENT DOCUMENTS

| | | |
|---|---|---|
| KR | 10-2012-0138037 A | 12/2012 |
| KR | 10-2013-0139060 A | 12/2013 |

\* cited by examiner

ORGANIC LIGHT EMITTING DISPLAY APPARATUS

CROSS-REFERENCE TO RELATED APPLICATION

Korean Patent Application No. 10-2015-0040970, filed on Mar. 24, 2015, in the Korean Intellectual Property Office, and entitled: "Organic Light Emitting Display Apparatus," is incorporated by reference herein in its entirety.

BACKGROUND

1. Field

The present disclosure herein relates to an organic light emitting display apparatus, and particularly to, an organic light emitting display apparatus having an encapsulation layer.

2. Description of the Related Art

Organic light emitting display apparatuses include organic light emitting elements with anode electrodes, organic light emitting layers, and cathode electrodes. An organic light emitting element emits light through the energy generated when excitons, which are generated through the recombination of electrons and holes inside an organic light emitting layer, fall from an excited state to a ground state, and an organic light emitting display apparatus displays a predetermined image by using this emitted light.

Organic light emitting display apparatuses have a self-luminance property, and unlike liquid crystal display apparatuses, do not require a separate light source, thus enabling the thickness and weight thereof to be reduced. Also, due to their high quality characteristics, e.g., low power consumption, high brightness, and fast response speed, organic light emitting display apparatuses have received attention as next generation display apparatuses.

SUMMARY

Embodiments provide an organic light emitting display apparatus that includes a substrate including a pixel region, a first electrode on the substrate, a second electrode on the first electrode, an organic light emission layer between the first and second electrodes to emit light, a plurality of layers on the second electrode, and a light compensation pattern on the second electrode and overlapping the pixel region, the light compensation pattern including a plurality of protrusion patterns having progressively decreasing widths as a distance from a center of the pixel region increases, and a plurality of grooves separating the protrusions in a direction parallel to the substrate from the center of the pixel region.

The light compensation pattern may be disposed on an upper surface of the second electrode, and integrally formed with the second electrode.

The plurality of layers may include an encapsulation layer, a polarizing plate, and an adhesive layer. The encapsulation layer may be disposed on the second electrode and cover the first electrode, the organic light emission layer, and the second electrode. The polarizing plate may be disposed on the encapsulation layer and circularly polarize incident light.

The adhesive layer may be interposed between and adhere to the encapsulation layer and the polarizing plate.

The light compensation pattern may be disposed on one surface of the encapsulation layer and integrally formed with the encapsulation layer.

The light compensation pattern may be disposed on one surface of the adhesive layer and integrally formed with the adhesive layer.

The plurality of layers may further include a window and a dispersion layer. The window may be disposed on the polarizing plate and form an outer surface. The dispersion layer may be disposed between the polarizing plate and the window and disperse the incident light.

The light compensation pattern may be disposed on one surface of the dispersion layer and integrally formed with the dispersion layer.

Each of the protrusion patterns may have a circular shape or a circular ring shape in a plan view.

Each of the protrusion patterns may have a polygonal shape or a polygonal ring shape in a plan view.

The widths of the grooves may be the same as one another.

In other embodiments, an organic light emitting display apparatus may include a substrate having a pixel region, a first electrode, a second electrode, an organic light emission layer, a plurality of layers, and a light compensation pattern.

The light compensation pattern may be formed on the second electrode and any one of the plurality of layers and formed corresponding to the pixel region. The light compensation pattern may include one groove including a plurality of layers connected to one another. The widths between the layers in one direction, which passes through a center of the pixel region and is parallel to the substrate, may become smaller progressively further from the center of the pixel region.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
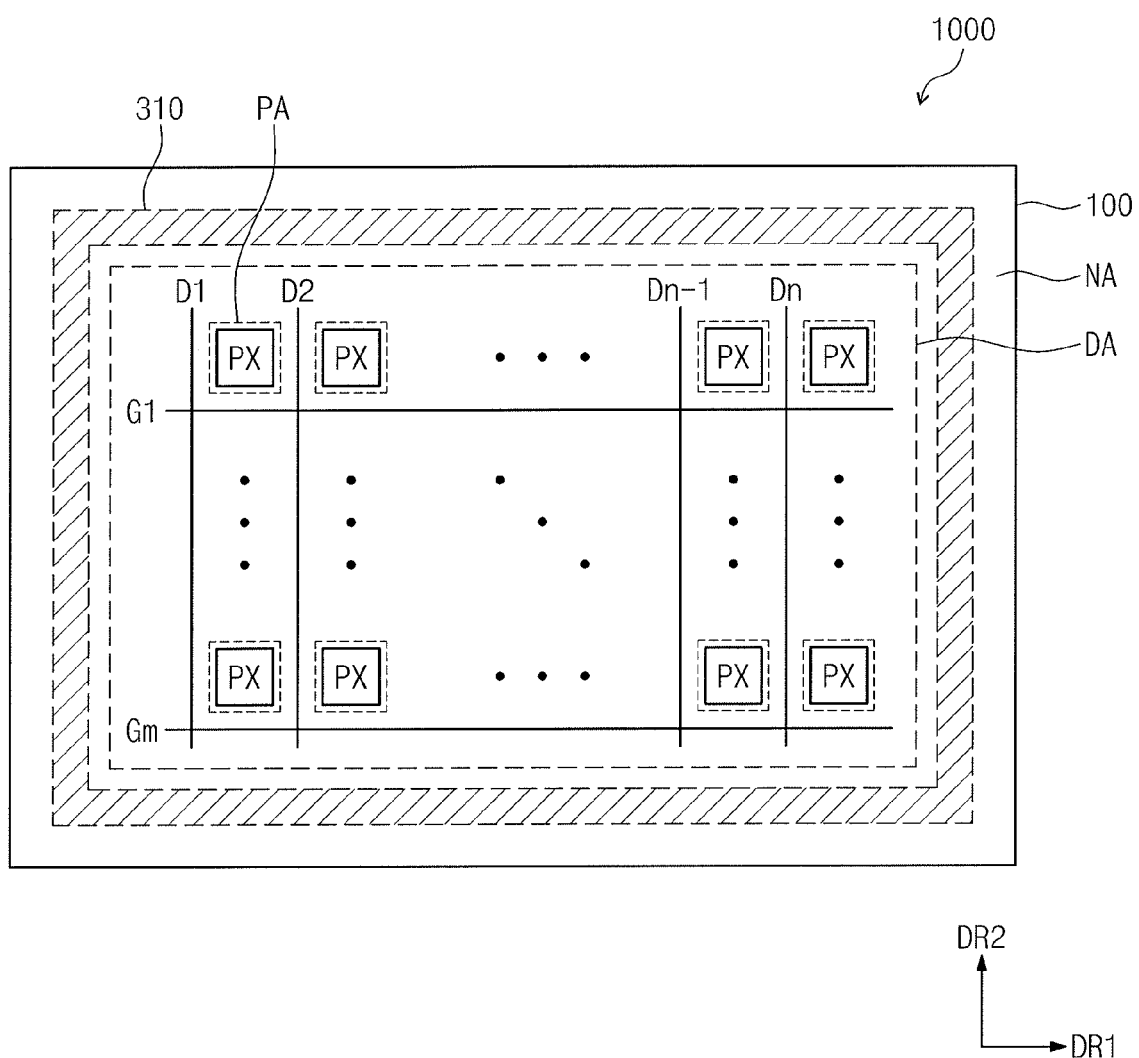
FIG. 1 illustrates a schematic plan view of an organic light emitting display apparatus.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
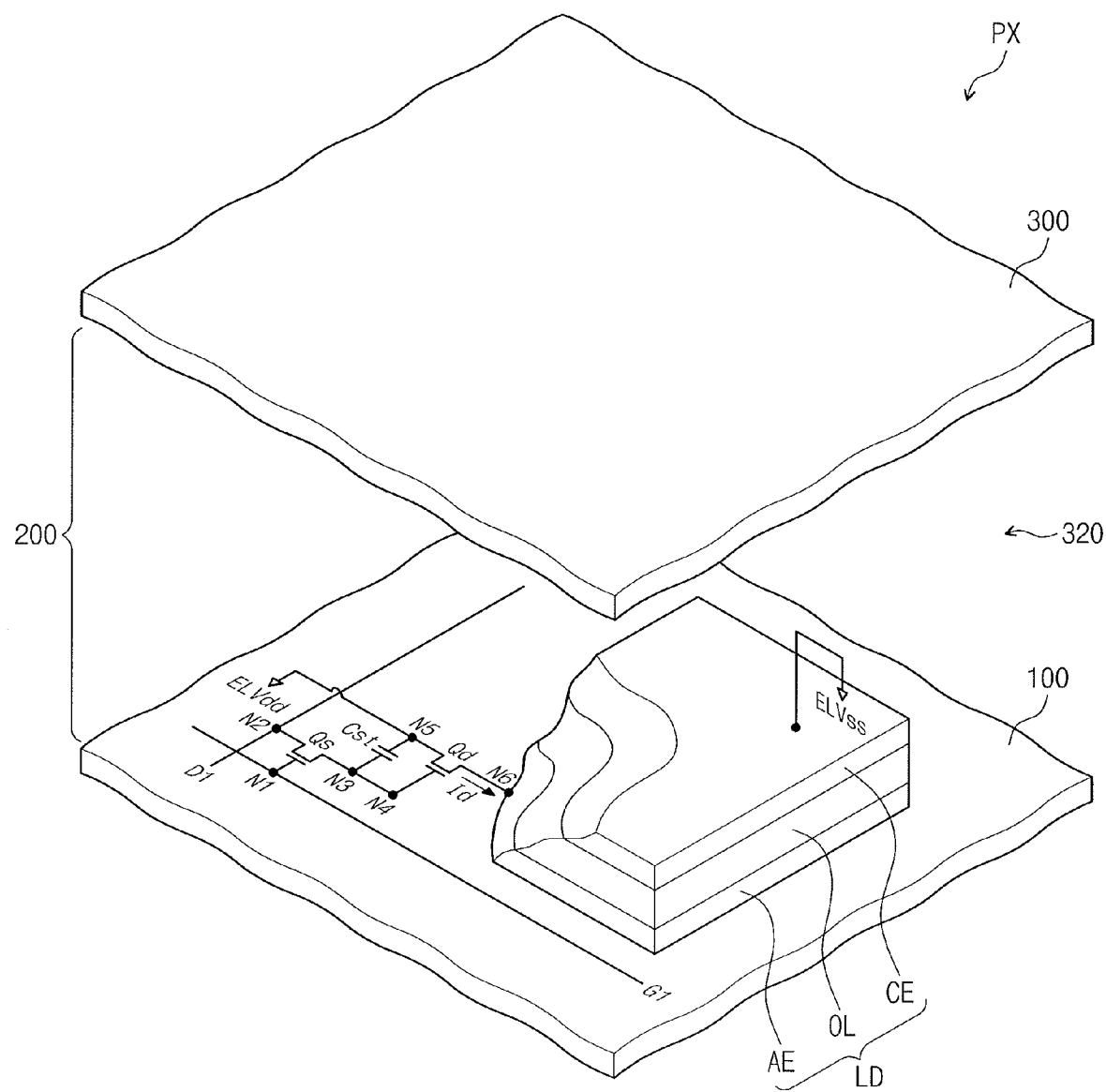
FIG. 2 illustrates a conceptual view of a pixel in FIG. 1.

FIG. 1 is a schematic plan view illustrating an organic light emitting display apparatus 1000, and FIG. 2 is a conceptual view illustrating a pixel illustrated in FIG. 1.

Referring to FIGS. 1-2, the organic light emitting display apparatus 1000 may include a substrate 100, a pixel layer 200, and an encapsulation layer 300.

The substrate 100 includes a display region DA for displaying an image and a non-display region NA which is adjacent to the display region DA and does not display an image. The display region DA may include a plurality of pixel regions PA.

The substrate 100 may be a flexible substrate, and may be formed of a plastic having good heat resistance and durability, e.g., polyethyleneterephthalate (PET), polyethylenenaphthalate, polycarbonate, polyarylate, polyetherimide, polyethersulphonate, and polyimide. However, embodiments are not limited thereto, e.g., the substrate 100 may be formed of metal or glass. A barrier film (not shown) for preventing external foreign substances, e.g., moisture or oxygen, from passing through the substrate 100 and penetrating into an organic light emitting element LD may be included between the substrate 100 and the pixel layer 200.

The pixel layer 200 may be disposed between the substrate 100 and the encapsulation layer 300. The pixel layer 200 includes a plurality of gate lines G1 to Gm, a plurality of data lines D1 to Dn, and a plurality of pixels PX. The gate lines G1 to Gm and the data lines D1 to Dn may be insulated from each other and cross each other. In FIG. 1, the gate lines G1 to Gm extending in a first direction DR1, and the data lines D1 to Dn extending in a second direction DR2 crossing the first direction DR1 are illustrated only as an example. However, embodiments are not limited thereto. When the gate lines G1 to Gm and the data lines D1 to Dn are insulated and cross, each of the gate lines G1 to Gm and the data lines D1 to Dn may have a shape which is not a straight line shape but a shape having a curved portion. The gate lines G1 to Gm and the data lines D1 to Dn may define the pixel regions PA.

Each of the pixels PX may be included in each of the pixel regions PA. Each of the pixels PX may be connected to any one of the gate lines G1 to Gm and any one of the data lines D1 to Dn to display an image. Each of the pixels PX may display any one from among red, green, and blue colors. However, embodiments are not limited thereto. Each of the pixels PX may display a color (for example, a white color) other than red, green, and blue colors. In FIG. 1, each of the pixels PX is illustrated as having a rectangular shape as an example, but embodiments are not limited thereto. The shape of each of the pixels PX may be variously varied into a polygon, a circle, an ellipse, etc.

In FIG. 2, a pixel connected to the first gate line G1 and the first data line D1 is illustrated as an example. Referring to FIG. 2, the pixel PX includes a switching transistor Qs, a driving transistor Qd, a storage capacitor Cst, and an organic light emitting element LD.

The switching transistor Qs may include a control terminal N1, an input terminal N2, and an output terminal N3. The control terminal N1 is connected to the first gate line G1, the input terminal N2 is connected to the first data line D1, and the output terminal N3 is connected to the driving transistor Qd. The switching transistor Qs responds to a gate signal applied to the first gate line G1 to output a data voltage applied to the data line D1 to the driving transistor Qd.

The switching transistor Qs may include a control terminal N4, an input terminal N5, and an output terminal N6. The control terminal N4 is connected to the output terminal N3 of the switching transistor Qs, the input terminal N5 receives a driving voltage ELVdd, and the output terminal N6 is connected to the organic light emitting element LD. The driving transistor Qd outputs an output current Id which has a magnitude varying according to the voltage applied between the control terminal N4 and the output terminal N6 to the organic light emitting element.

The storage capacitor Cst may be connected between the output terminal N3 of the switching transistor Qs and the input terminal N5 of the driving transistor Qd. The storage capacitor Cst charges a data voltage applied to the control terminal N4 of the driving transistor Qd, and maintains the charged data voltage for a predetermined period after the switching transistor Qs is turned off.

The pixel layer 200 may further include a driving voltage line (not shown). The driving voltage line may extend parallel to the first gate line G1 or to the first data line D1. The driving voltage line may receive the driving voltage ELVdd and may be connected to the input terminal N5 of the driving transistor Qd.

The organic light emitting element LD may include a first electrode AE, an organic layer OL, and a second electrode CE.

The first electrode AE may be an anode electrode or a positive electrode. The first electrode AE is connected to the output terminal N6 of the driving transistor Qd to generate holes. The second electrode CE may be a cathode electrode or a negative electrode. The second electrode CE receives a common voltage ELVss and generates electrons. The organic layer OL may be disposed between the first electrode AE and the second electrode CE. The organic layer OL may be formed of a plurality of layers and contain organic materials.

Holes and electrons are respectively injected inside the organic layer OL from the first electrode AE and the second electrode CE. Inside the organic layer OL, excitons which are combinations of the holes and the electrons are formed, and light is emitted while the excitons fall from an excited state to a ground state. The intensity of light emitted in the organic layer OL may be determined by an output current Id flowing through the output terminal N6 of the driving transistor Qd.

In FIG. 2, it is illustrated as an example that the second electrode is disposed over the first electrode AE, but embodiments are not limited thereto, e.g., the positions of the first and second electrodes AE and CE may be switched.

The encapsulation layer 300 may be disposed over the pixel layer 200. The encapsulation layer 300 may cover the display region DA. The encapsulation layer 300 may be formed of an organic or inorganic layer. However, embodiments are not limited thereto, e.g., the encapsulation layer 300 may be provided as a substrate formed of glass or plastic.

The organic light emitting display apparatus 1000 may further include a sealing member 310. The sealing member 310 is disposed to surround the display region DA, and may bond the substrate 100 and the encapsulation layer 300. The sealing member 310 together with the encapsulation layer 300 may prevent the organic light emitting element LD from being exposed to, e.g., external moisture, air, etc.

An inner space 320 defined by the pixel layer 200, the encapsulation layer 300, and the sealing member 310 may be formed as a vacuum, but embodiments are not limited thereto. For example, the inner space 320 may be filled with nitrogen ($N_2$) or a filling member formed of an insulating material.

In an embodiment, any one of the layers disposed on the organic layer OL is defined as an optical compensation layer. The optical compensation layer diffuses light emitted from the organic layer OL to have a wide emission angle, and may improve light emission efficiency.

Figure 3:
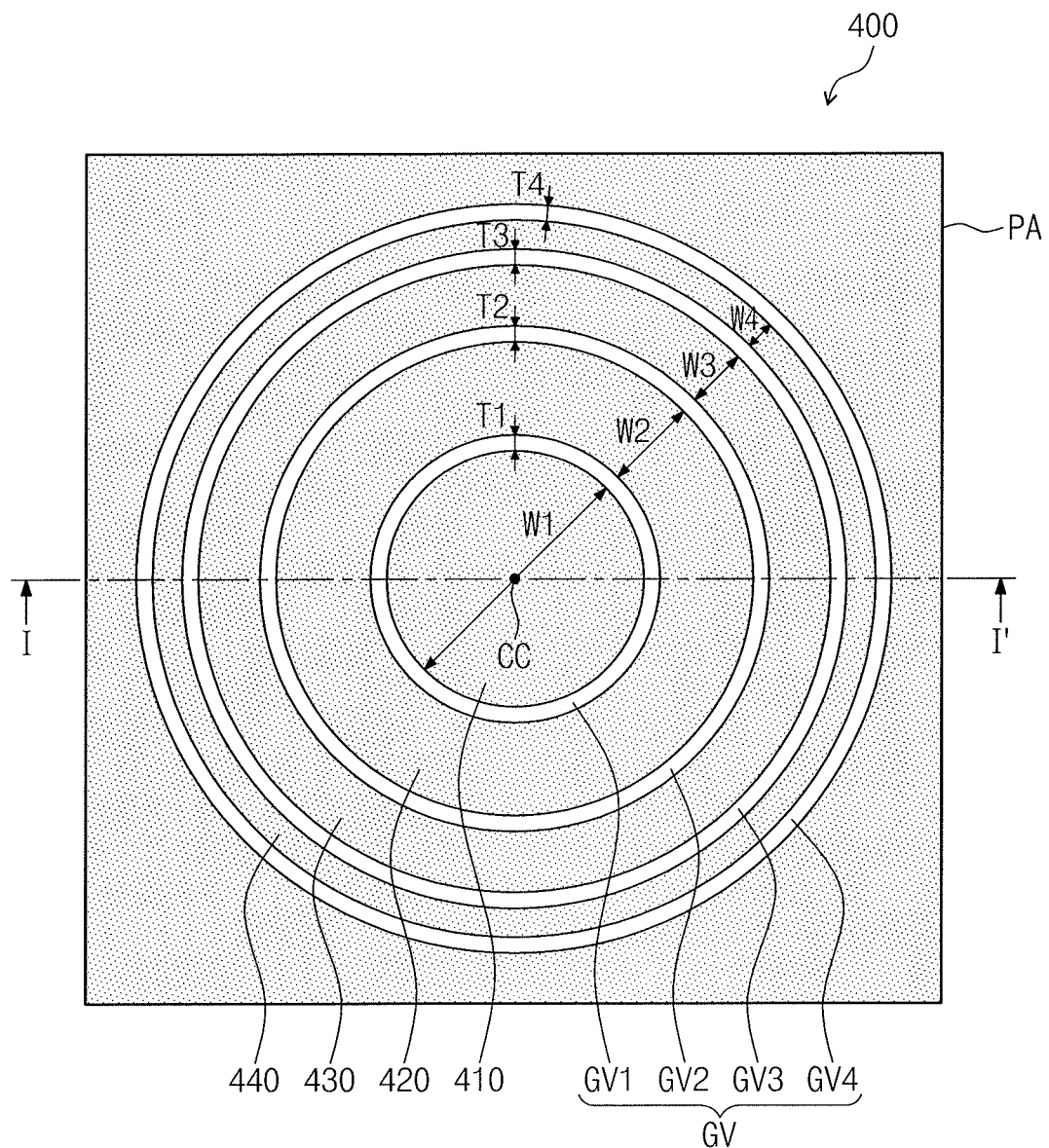
FIG. 3 illustrates a plan view of a light compensation pattern of one pixel in FIG. 1.
Figure 4:
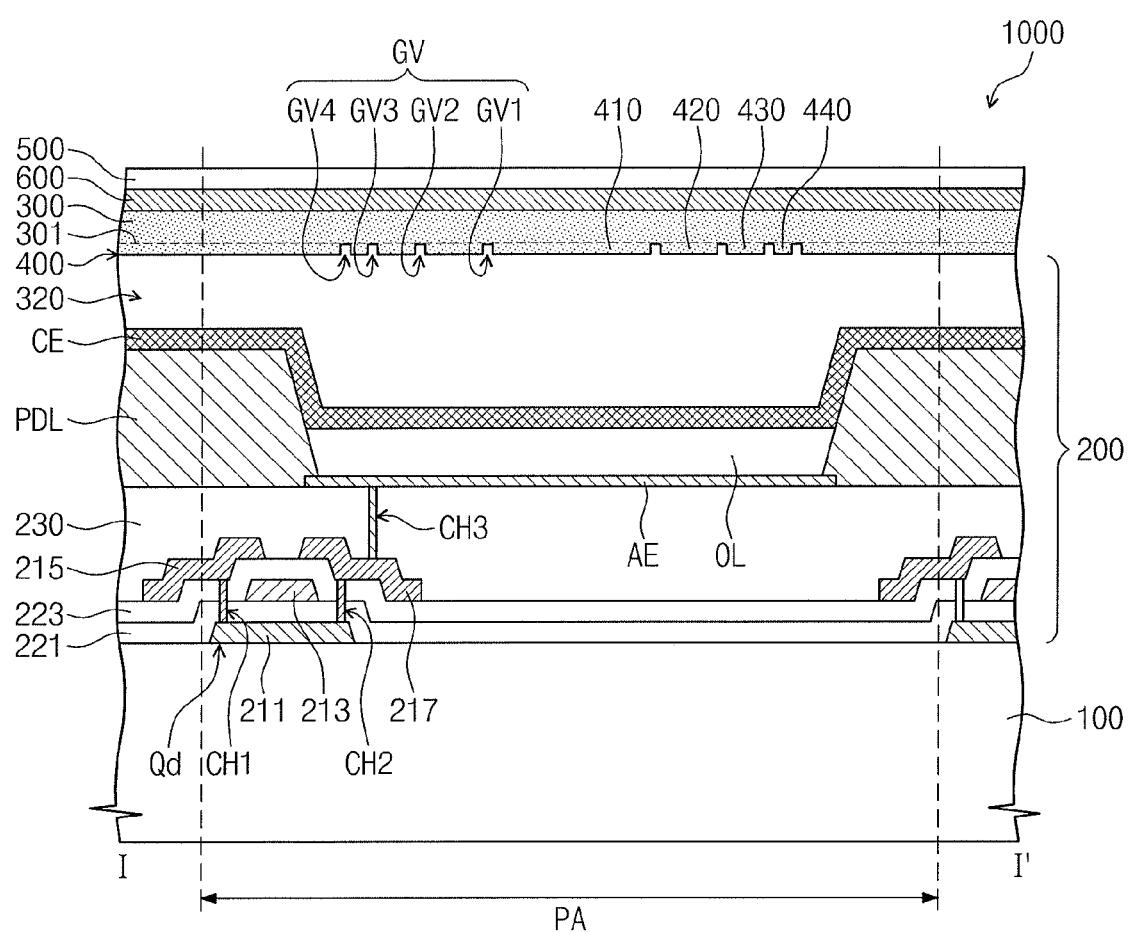
FIG. 4 illustrates a cross-sectional view along line I-I' of FIG. 3.

FIG. 3 is a plan view illustrating a light compensation pattern of one pixel illustrated in FIG. 1 in an organic light emitting display apparatus according to an embodiment. FIG. 4 is a cross-sectional view taken along line I-I' of FIG. 3.

Referring to FIGS. 3 and 4, the driving transistor Qd may include an active layer 211, a gate electrode 213, a source electrode 215, and a drain electrode 217.

The active layer 211 may be disposed on the substrate 100. The pixel layer 200 may further include a first insulation film 221 disposed between the active layer 211 and the gate electrode 213. The first insulation film 221 may insulate the active layer 211 and the gate electrode 213 from each other. The source electrode 215 and the drain electrode 217 may be disposed on the gate electrode 213. The pixel layer 200 may further include a second insulation film 223 disposed between the gate electrode 213 and each of the source electrode 215 and the drain electrode 217. Each of the source electrode 215 and the drain electrode 217 may be connected to the active layer 211 through contact holes CH1 and CH2 prepared in the first and second insulation films 221 and 223.

Embodiments are not limited to the structure of the driving transistor Qd illustrated in FIG. 4, and the positions of the active layer 211, the gate electrode 213, the source electrode 215, and the drain electrode 217 may be varied in various shapes. For example, in FIG. 4, although it is illustrated that the gate electrode 213 is disposed on the active layer 211, the gate electrode may be disposed under the active layer 211.

The pixel electrode 200 may further include a protective film 230 disposed on the source electrode 215 and the drain electrode 217. The first electrode AE is disposed on the protective layer 230. The first electrode AE is connected to the drain electrode 217 through a contact hole CH3 formed in the protective layer 230. The first electrode AE may be formed of a plurality of layers. For example, the first electrode AE may have a double-layered structured including a reflective electrode and a transparent electrode disposed on the reflective electrode. The reflective electrode may be formed of, e.g., Ag, Mg, Al, Pt, Pd, Au, Ni, Nd, Ir, Cr or compounds thereof. The transparent electrode may be transparent or semi-transparent, and may include any one or more of, e.g., indium tin oxide (ITO), indium zinc oxide (IZO), zinc oxide (ZnO), indium oxide ($In_2O_3$), indium gallium oxide (IGO) and aluminum zinc oxide (AZO).

The pixel electrode 200 may further include a pixel defining film PDL disposed on the protective film 230. The pixel defining film PDL may be disposed to overlap a border of the pixel regions PA of FIG. 1 in a plan view.

The organic layer OL may include an organic light emission layer (EML) formed of a low molecular weight or a high molecular weight organic material. The organic light emission layer may emit light. The organic layer OL may selectively include a hole transport layer (HTL), a hole injection layer (HIL), an electron transport layer (ETL), and an electron injection layer (EIL) in addition to the light emission layer.

The organic light emitting display apparatus 1000 may further include a polarizing plate 500 and an adhesive layer 600. The polarizing plate 500 may circularly polarize the incident light. The adhesive layer 600 may be interposed between and adhere to the encapsulation layer 300 and the polarizing plate 500.

In the organic light emitting display apparatus 1000 according to an embodiment, the light compensation pattern 400 may be disposed on a lower surface 301 of the encapsulation layer 300, i.e., on a surface of the encapsulation layers 300 that faces the second electrode CE. The light compensation pattern 400 may be formed to correspond to one pixel region PA. Although the light compensation pattern 400 is described separately from the encapsulation layer 300, they may be integrally formed.

The light compensation pattern 400 may include a plurality of protrusion patterns 410 to 440 separated by a plurality of grooves GV. In an embodiment, as illustrated in FIGS. 3 and 4, the plurality of grooves GV may include first to fourth grooves GV1 to GV4 sequentially disposed in a direction parallel to the substrate 100 from a center CC of the pixel region PA. The light compensation pattern 400 may include first to fourth protrusion patterns 410 to 440 separated by the first to fourth grooves GV1 to GV4. In FIGS. 3 and 4, although the four grooves GV1 to GV4 and the four protrusion patterns 410 to 440 are illustrated as an example, embodiments are not limited thereto, e.g., the light compensation pattern 400 may include five or more protrusion patterns separated by five or more grooves.

In a plan view, as illustrated in FIG. 3, each of the first to fourth grooves GV1 to GV4 may have a circular ring shapes. Similarly, in a plan view, the first protrusion pattern 410 may have a circular shape, and the second to fourth protrusion patterns 420 to 440 may have circular ring shapes. The first to fourth protrusion patterns 410 to 440, and the first to fourth grooves GV1 to GV4 are alternately and concentrically arranged around the center CC of the pixel region PA.

The protrusion patterns 410 to 440 may have a smaller width W progressively further from the center CC of the pixel region PA. A width W1 of the first protrusion pattern 410 equals a diameter of the first protrusion pattern 410. Further, a width of each of the second to fourth protrusion patterns 420 to 440 equals a difference between corresponding inner and outer radii of each protrusion pattern. The width the second to fourth protrusion patterns 420 to 440 may be measured along an extension line of the diameter of the first protrusion pattern 410, i.e., a straight line passing through the center CC of the pixel region PA. The width W1 of the first protrusion pattern 410, the width W2 of the second protrusion pattern 420, the width W3 of the third protrusion pattern 430, and the width W4 of the fourth protrusion pattern 410 may have smaller values in that order, i.e., as a distance from the center CC of the pixel region PA increases.

The widths T1 to T4 of the first to fourth grooves GV1 to GV4 may be the same as one another. As illustrated in FIG. 4, the first to fourth grooves GV1 to GV4 are facing the inner space 320, e.g., the first to fourth grooves GV1 to GV4 may be in fluid communication with the inner space 320.

As the widths of the protrusion patterns 410 to 440 of the light compensation pattern 400 become smaller, refraction of the incident light increases. As the widths of the protrusion patterns 410 to 440 become larger, refraction of the incident light decreases. For example, light passing through the first protrusion pattern 410 may be refracted less with respect to the incident direction than light passing through the fourth protrusion pattern 440.

Figure 5:
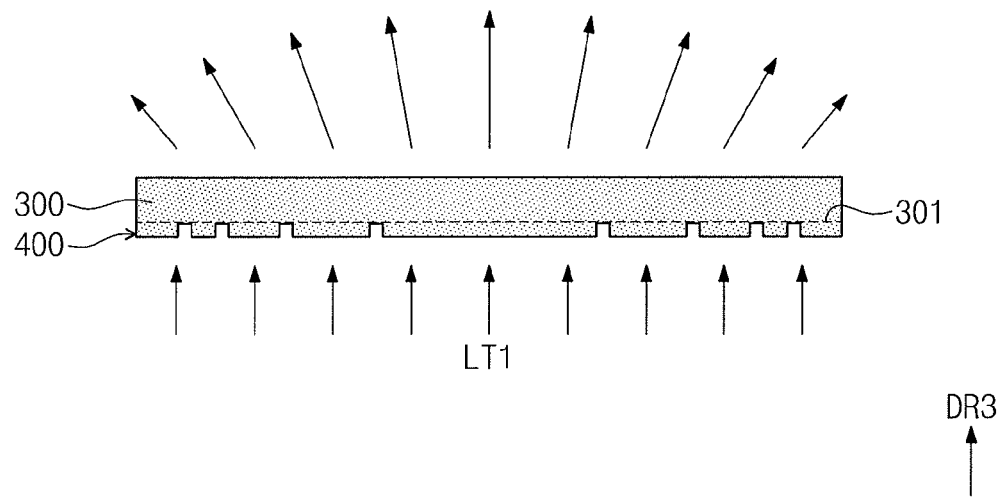
FIGS. 5 and 6 illustrate schematic views of light incident to and emitted from an encapsulation layer having a light compensation pattern formed therein.
Figure 6:
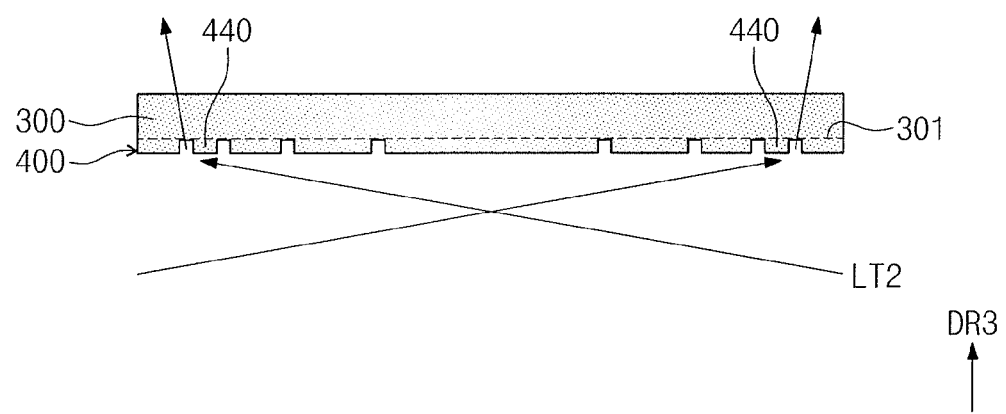

FIGS. 5 and 6 are schematic views illustrating light incident to and emitted from the encapsulation layer 300 having the light compensation pattern 400 formed therein. In FIGS. 5 and 6, for convenience of description, only the light compensation pattern 400 and the encapsulation layer 300 are illustrated. In FIGS. 5 and 6, the effect of an organic light emitting display apparatus is described based on changes in the path of the light incident on the encapsulation layer 300 which has the light compensation pattern 400 formed therein.

Referring to FIG. 5, a case is described in which light LT1 is incident in a direction parallel to a thickness direction DR3 of the encapsulation layer 300 from a lower portion of the encapsulation layer 300 which has the light compensation pattern 400 formed therein. That is, the light LT1 is incident on the light compensation pattern 400 to be transmitted through the encapsulation layer 300 and to be emitted from a top surface of the encapsulation layer 300.

In detail, the light LT1 may be incident on the protrusion patterns of the light compensation pattern 400, so the light LT1 is refracted at various angles by the first to fourth protrusion patterns 410 to 440 due to the different widths thereof to be emitted to the outside of the encapsulation layer 300. Accordingly, the light compensation pattern 400 reduces the color shift phenomenon in which colors appear to be shifted according to a viewing angle by diffusing the light which has a wavelength determined by passing through the pixel layer 200 of FIG. 4.

Referring to FIG. 6, a case is described in which light LT2 is incident at a direction inclined, i.e., at an oblique angle, with respect to the thickness direction DR3 of the encapsulation layer 300 from a lower portion of the encapsulation layer 300 which has the light compensation pattern 400 formed therein. In FIG. 6, the light LT2 is assumed to be incident on the fourth protrusion pattern 440 at the most inclined angle thereto, from the light emitted from the pixel corresponding to the light compensation pattern 400.

Since the incident light LT2 to the fourth protrusion pattern 440 is refracted to a relatively high degree, the ratio of the light emitted to the outside of the encapsulation layer, from the second light LT2, may be increased. That is, the organic light emitting display apparatus 1000 having the light compensation pattern 400 may have a high light emission efficiency.

FIGS. 7 to 10 are cross-sectional views taken along line I-I' of FIG. 3 in organic light emitting display apparatuses according to other embodiments.

The difference between organic light emitting display apparatuses 1001 to 1004 illustrated in FIGS. 7 to 10 and the organic light emitting display apparatus 1000 in FIG. 4 is mainly described below.

Figure 7:
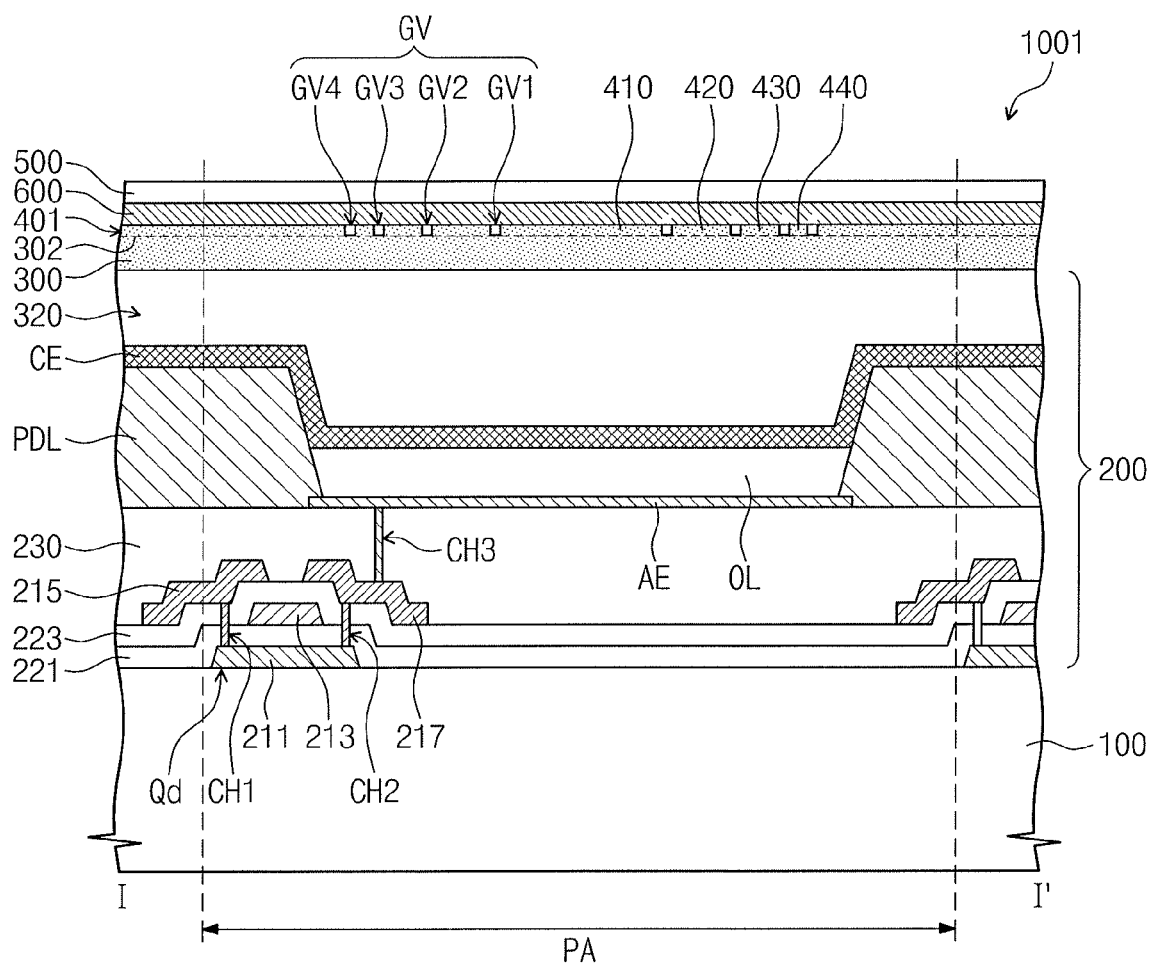
FIGS. 7 to 10 illustrate cross-sectional views along line I-I' of FIG. 3 according to other embodiments.

The organic light emitting display apparatus 1001 illustrated in FIG. 7 may include a light compensation pattern 401. The light compensation pattern 401 may be disposed on an upper surface 302 of the encapsulation layer 300, i.e., the grooves GV may face the adhesive layer 600. The light compensation pattern 401 may be integrally formed with the encapsulation layer 300.

Figure 8:
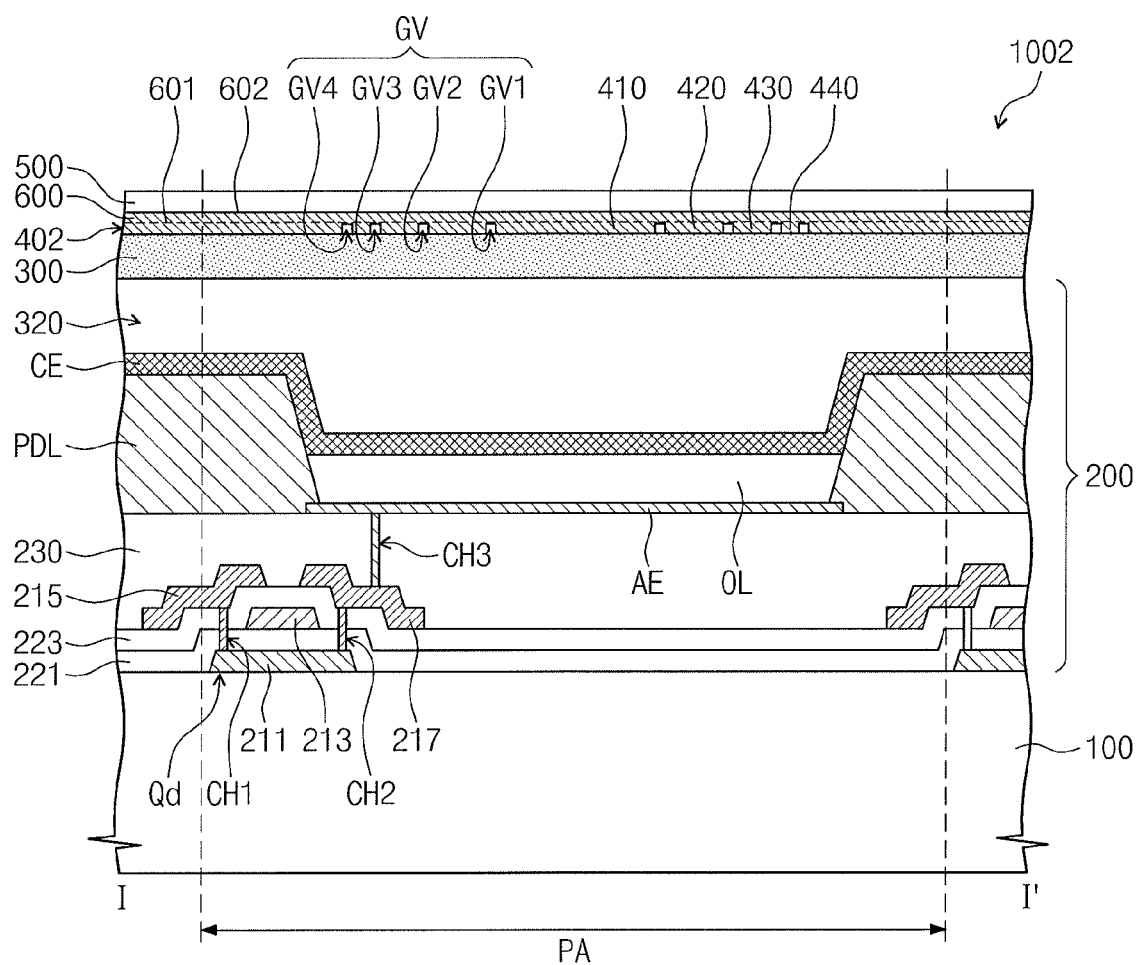

The organic light emitting display apparatus 1002 illustrated in FIG. 8 may include a light compensation pattern 402. The light compensation pattern 402 may be disposed on a lower surface 601 of the adhesive layer 600. The light compensation pattern 402 may be integrally formed with the adhesive layer 600. However, embodiments are not limited thereto, e.g., the light compensation pattern 402 may be disposed on an upper surface 602 of the adhesive layer 600.

Figure 9:
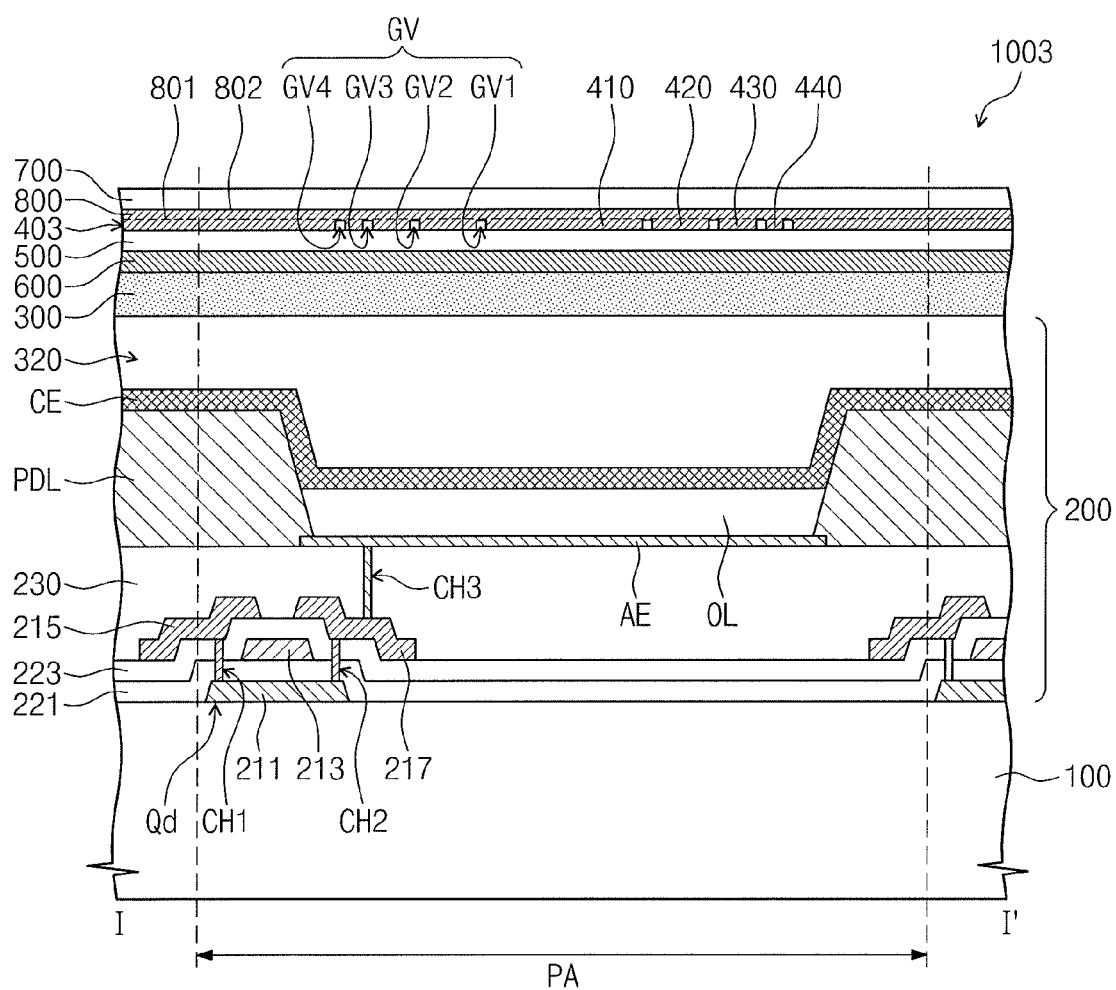

The organic light emitting display apparatus 1003 illustrated in FIG. 9 may further include a window 700 and a dispersion layer 800. The window 700 forms an outer surface of the organic light emitting display apparatus 1003. The window 700 may be formed of glass or plastic.

The dispersion layer 800 may be disposed between the polarizing plate 500 and the window 700. The dispersion layer 800 functions to disperse the incident light.

The light compensation pattern 403 may be disposed on a lower surface 801 of the dispersion layer 800. The light compensation pattern 403 may be integrally formed with the dispersion layer 800. However, embodiments are not limited thereto, e.g., the light compensation pattern 403 may be disposed on an upper surface 802 of the dispersion layer 800.

Figure 10:
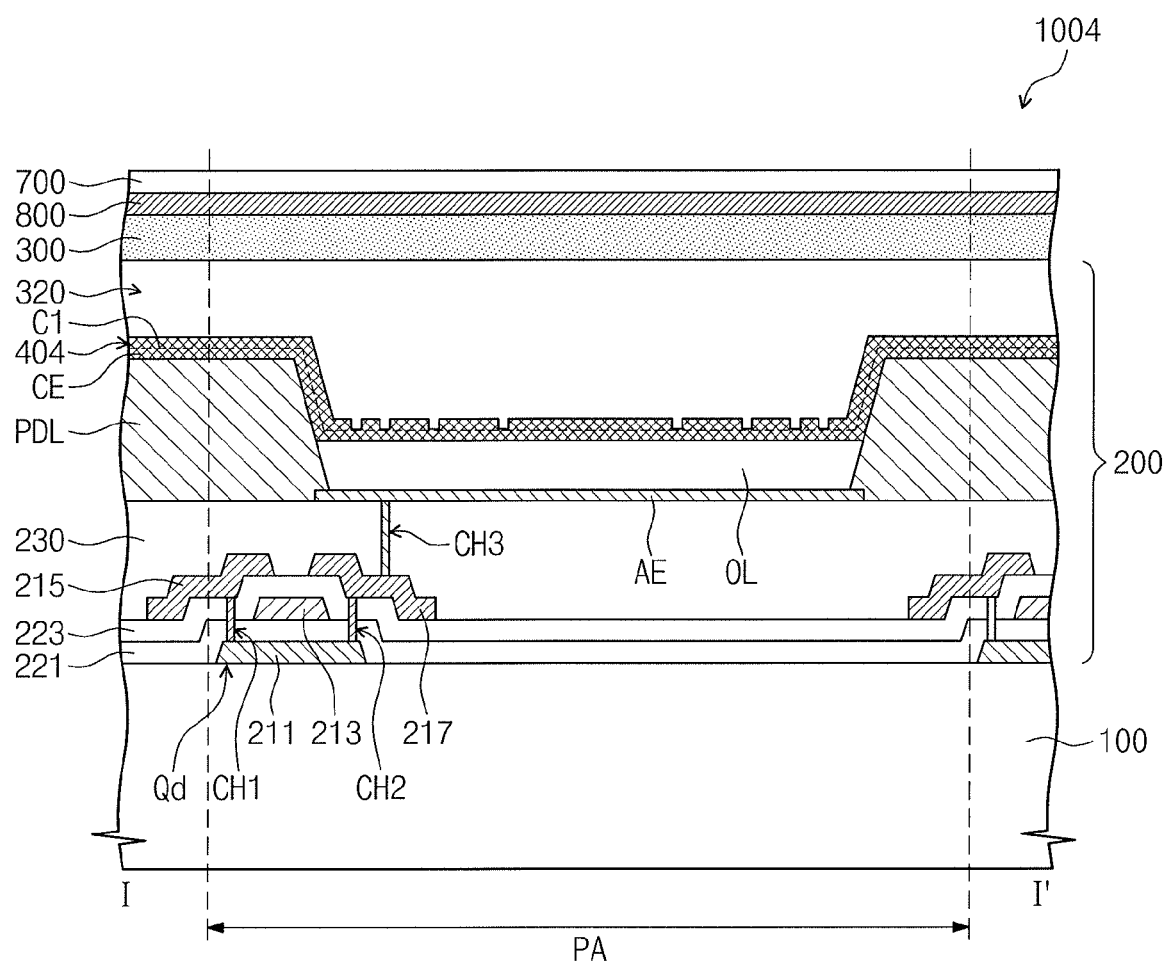

The organic light emitting display apparatus 1004 illustrated in FIG. 10 may include a light compensation pattern 404. The light compensation pattern 404 may be disposed on an upper surface C1 of a second electrode CE. The light compensation pattern 404 may be integrally formed with the second electrode CE.

Figure 11:
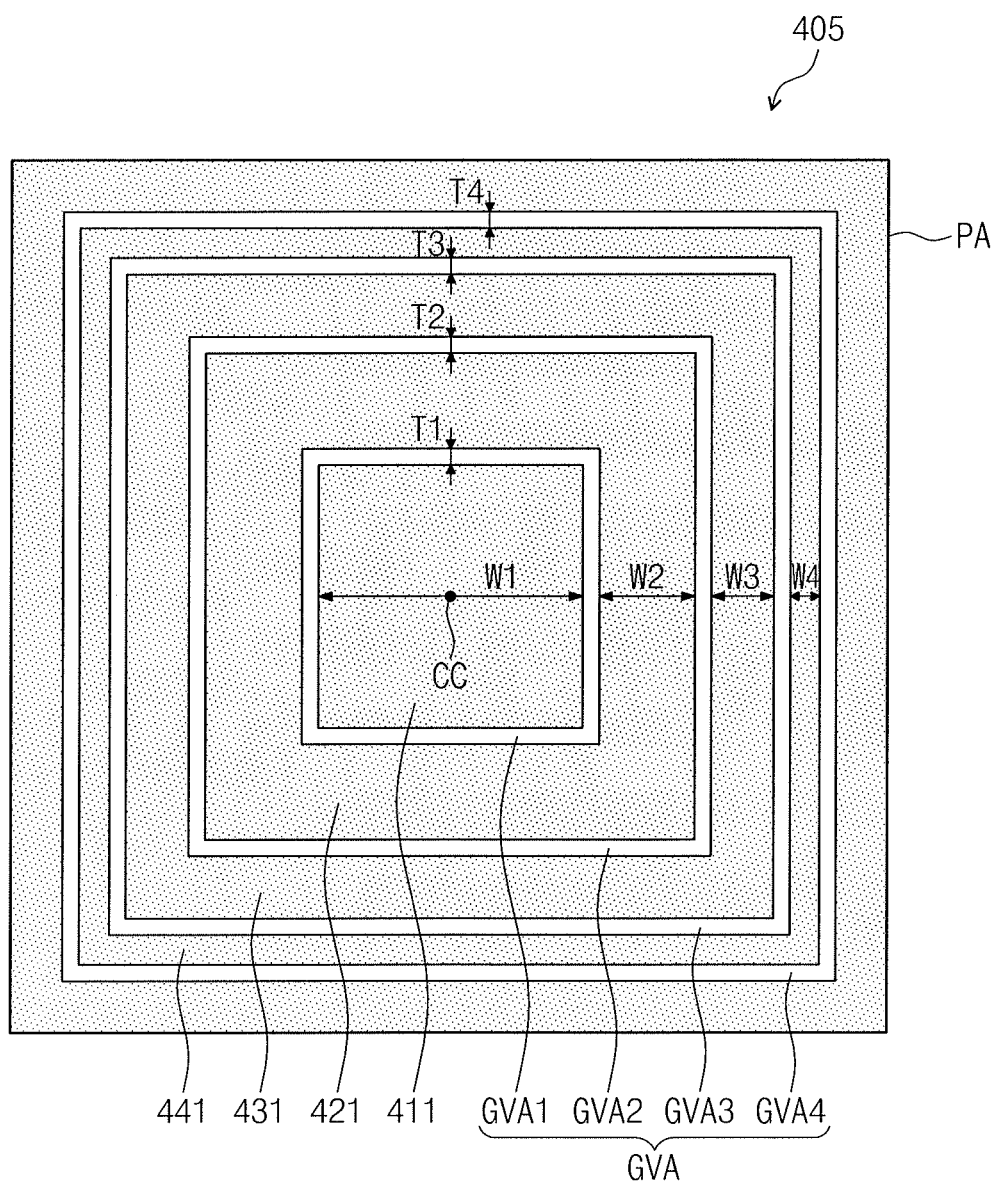
FIGS. 11 and 12 illustrate plan views of light compensation patterns of one pixel in organic light emitting display apparatuses according to other embodiments.
Figure 12:
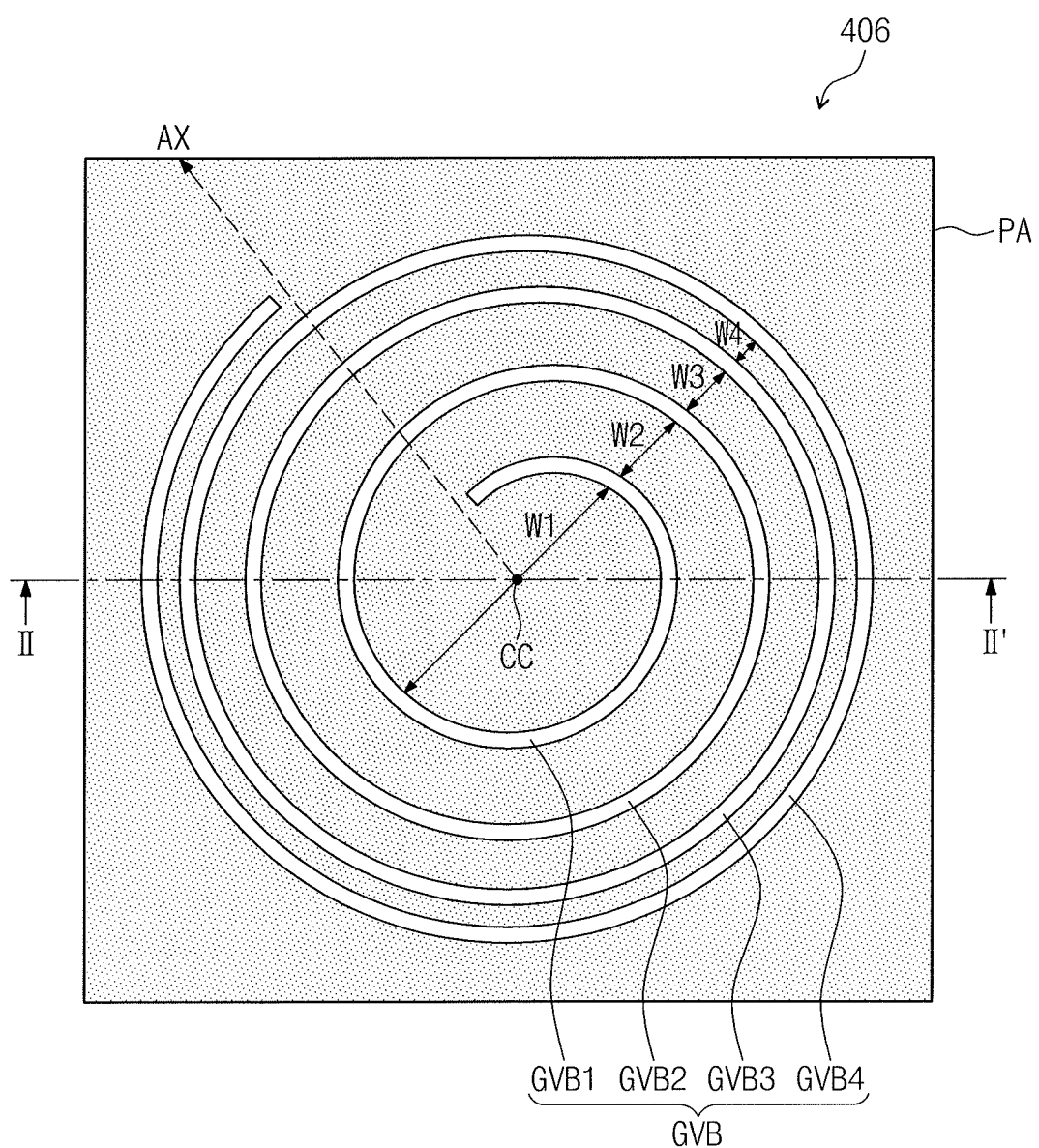

FIGS. 11 and 12 are plan views illustrating light compensation patterns according to other embodiments.

The difference between light compensation patterns 405 and 406 illustrated in FIGS. 11 and 12, respectively, and the light compensation pattern 400 illustrated in FIG. 3 is mainly described.

Referring to FIG. 11, the light compensation pattern 405 may include a plurality of protrusion patterns 411 to 441 separated by a plurality of grooves GVA. The plurality of grooves GVA may include first to fourth grooves GVA1 to GVA4 sequentially disposed in one direction parallel to the substrate 100 from the center CC of a pixel region PA. The light compensation pattern 405 may include first to fourth protrusion patterns 411 to 441 separated by the first to fourth grooves GVA1 to GVA4.

In a plan view, each of the first to fourth grooves GVA1 to GVA4 may have a polygonal ring shapes. In FIG. 11, the first to fourth grooves GVA1 to GVA4 are illustrated having rectangular ring shapes as an example. In a plan view, the first protrusion pattern 411 may have a rectangular shape, and the second to fourth protrusion patterns 421 to 441 may have a rectangular ring shapes.

The width W1 of the first protrusion pattern 411, the width W2 of the second protrusion pattern 421, the width W3 of the third protrusion pattern 431, and the width W4 of the fourth protrusion pattern 441 may have smaller values in that order.

The widths T1 to T4 of the first to fourth grooves GVA may be the same as one another. As the widths of the protrusion patterns 411 to 441 of the light compensation pattern 405 become smaller, the incident light is refracted more, and as the widths of the protrusion patterns 411 to 441 become larger, the incident light is refracted less.

Referring to FIG. 12, the light compensation pattern 406 may have one groove GVB formed therein. In a plan view, the groove GVB has a spiral shape. The groove GVB may have a plurality of layers GVB1 to GVB4 divided by an imaginary line AX extending from the center CC of the pixel region PA to the outside of the pixel region PA.

The layers GVB1 to GVB4 are all connected with one another and have larger radii of curvature progressively further from the center of the pixel region PA. In FIG. 12, although the grooves GVB are illustrated to have the first to fourth layers GVB1 to GVB4 as an example, the layers GVB1 to GVB4 may become four of five according to the setting of the imaginary line AX.

The layers disposed at the periphery of the pixel region PA (for example, the fourth layer GVB4) may surround at least a portion of the layers disposed adjacent to the center CC of the pixel region PA (for example, the first layer GVB1).

The widths W1 to W4 between the layers GVB1 to GVB4, in one direction parallel to the substrate 100 and passing through the center CC of the pixel region PA, may become smaller progressively from the center CC of the pixel region PA toward the periphery of the pixel region PA. The widths of each of the plurality of layers GVB1 to GVB4 of the groove GVB may be the same as one another.

Since the groove GVB is provided in a spiral shape, the light compensation pattern 406 is electrically connected.

Figure 13:
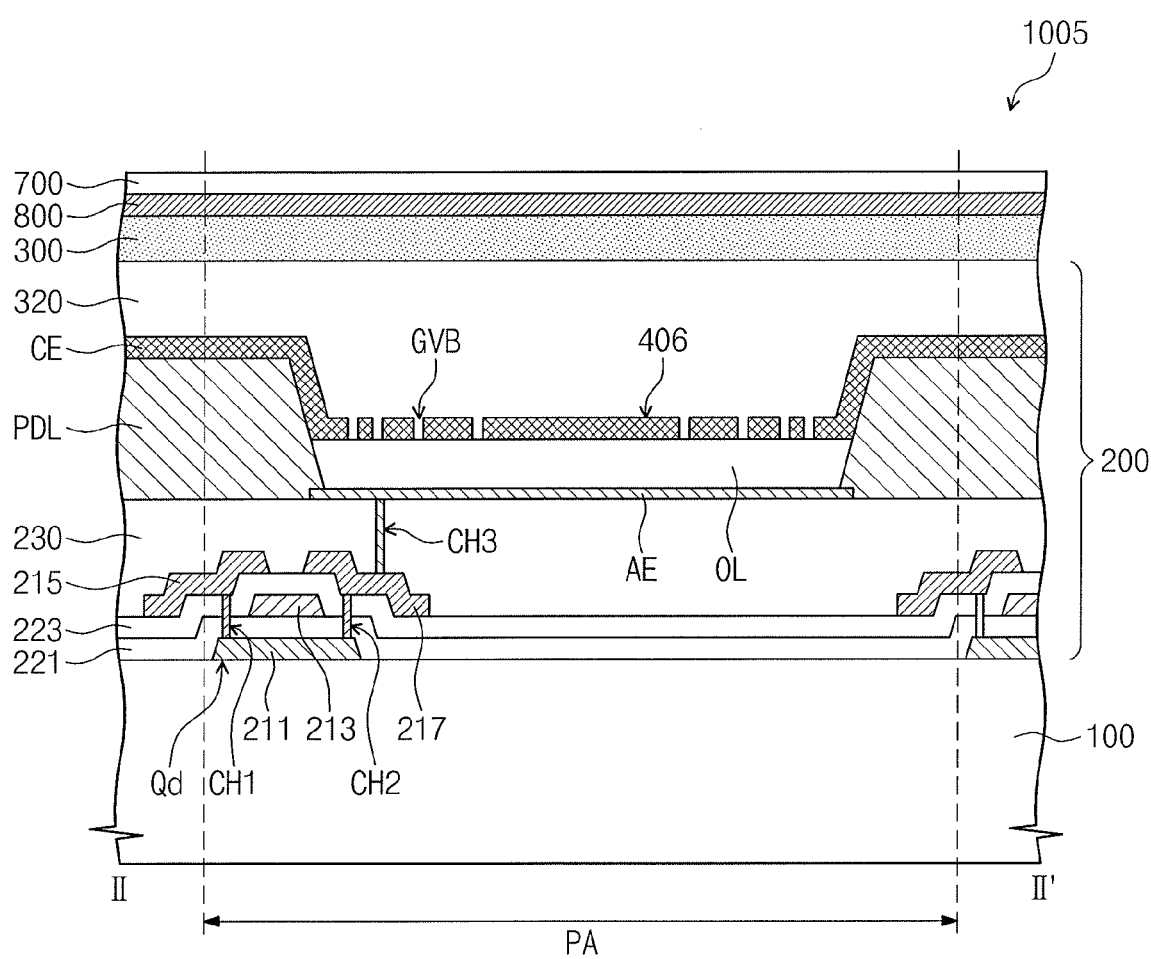
FIG. 13 illustrates a cross-sectional view along line II-II' of FIG. 12.

FIG. 13 is a cross-sectional view taken along line II-II' of FIG. 12 in an organic light emitting display apparatus according to another embodiment.

Referring to FIG. 13, the light compensation pattern 406 may be formed on the second electrode CE. The groove GVB may penetrate the second electrode CE. Since the light compensation pattern 406 disposed in one pixel region PA is electrically connected, the second electrode CE, with the exception of a region having the groove GVB, may receive a common voltage.

By way of summation and review, in organic light emitting display apparatuses, a color shift phenomenon may occur, i.e., when colors are shown to be shifted according to the viewing angle, because the resonance distance of light emitted from an organic light emitting layer is changed. Also, the ratio of light emitted to the outside of the organic light emitting display apparatus, from the portion of the light emitted at an angle to a substrate from the organic light emitting layer, is not high.

In contrast, the present disclosure provides an organic light emitting display apparatus capable of reducing a viewing angle-related color shift phenomenon. The present disclosure also provides an organic light emitting display apparatus having relatively high light extraction efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display apparatus, comprising:
    a substrate including a pixel region;
    a first electrode on the substrate;
    a second electrode on the first electrode;
    an organic light emission layer between the first and second electrodes to emit light;
    a plurality of layers on the second electrode; and
    a light compensation pattern on the second electrode and overlapping the pixel region, the light compensation pattern including:
        a plurality of protrusion patterns having progressively decreasing widths as a distance from a center of the pixel region increases, and
        a plurality of grooves separating the protrusions from one another in a direction parallel to the substrate from the center of the pixel region.

2. The organic light emitting display apparatus as claimed in claim 1, wherein the light compensation pattern is on an upper surface of the second electrode, the light compensation pattern being integral with the second electrode.

3. The organic light emitting display apparatus as claimed in claim 1, wherein the plurality of layers include:
    an encapsulation layer on the second electrode and covering the first electrode, the organic light emission layer, and the second electrode;
    a polarizing plate on the encapsulation layer to circularly polarize incident light; and
    an adhesive layer between and adhering to the encapsulation layer and the polarizing plate.

4. The organic light emitting display apparatus as claimed in claim 3, wherein the light compensation pattern is on one surface of the encapsulation layer, the light compensation pattern being integral with the encapsulation layer.

5. The organic light emitting display apparatus as claimed in claim 3, wherein the light compensation pattern is on one surface of the adhesive layer, the light compensation pattern being integral with the adhesive layer.

6. The organic light emitting display apparatus as claimed in claim 3, wherein the plurality of layers further comprise:
    a window on the polarizing plate to define an outer surface; and
    a dispersion layer between the polarizing plate and the window to dispersing the incident light.

7. The organic light emitting display apparatus as claimed in claim 1, wherein the light compensation pattern is on one surface of the dispersion layer, the light compensation pattern being integral with the dispersion layer.

8. The organic light emitting display apparatus as claimed in claim 1, wherein each of the protrusion patterns has a circular shape or a circular ring shape in a plan view.

9. The organic light emitting display apparatus as claimed in claim 1, wherein each of the protrusion patterns has a polygonal shape or a polygonal ring shape in a plan view.

10. The organic light emitting display apparatus as claimed in claim 1, wherein the widths of the grooves are the same as one another.

11. An organic light emitting display apparatus, comprising:
    a substrate including a pixel region;
    a first electrode on the substrate;
    a second electrode on the first electrode;
    an organic light emission layer between the first and second electrodes to emit light;
    a plurality of layers on the second electrode; and
    a light compensation pattern on the second electrode and overlapping the pixel region, the light compensation pattern including one groove having a plurality of layers connected to one another, widths among the plurality of layers, which extend in a direction passing through a center of the pixel region and are parallel to the substrate, become progressively smaller as a distance from the center of the pixel region increases.

12. The organic light emitting display apparatus as claimed in claim 11, wherein the plurality of layers include:
    a first layer adjacent to the center of the pixel region; and a second layer spaced farther apart from the center of the pixel region than the first layer, the second layer surrounding at least a portion of the first layer.

13. The organic light emitting display apparatus as claimed in claim 11, wherein the widths of the layers are the same as one another.

14. The organic light emitting display apparatus as claimed in claim 11, wherein the groove has a spiral shape in a plan view.

15. The organic light emitting display apparatus as claimed in claim 11, wherein the light compensation pattern is on the second electrode.

16. The organic light emitting display apparatus as claimed in claim 15, wherein the groove penetrates the second electrode.

* * * * *